United States Patent
Fleury et al.

(10) Patent No.: US 7,452,603 B2
(45) Date of Patent: Nov. 18, 2008

(54) TRANSPARENT SUBSTRATE COMPRISING A STACK OF THIN LAYERS FOR ELECTROMAGNETIC ARMOUR

(75) Inventors: Carinne Fleury, Paris (FR); Sylvain Belliot, Paris (FR); Estelle Mainpin, Paris (FR)

(73) Assignee: Saint-Gobain Glass France, Courbevoie (FR)

(*) Notice: Subject to any disclaimer, the term of this patent is extended or adjusted under 35 U.S.C. 154(b) by 215 days.

(21) Appl. No.: 10/572,286

(22) PCT Filed: Aug. 18, 2004

(86) PCT No.: PCT/FR2004/002152

§ 371 (c)(1),
(2), (4) Date: Mar. 16, 2006

(87) PCT Pub. No.: WO2005/028391

PCT Pub. Date: Mar. 31, 2005

(65) Prior Publication Data

US 2006/0280951 A1 Dec. 14, 2006

(30) Foreign Application Priority Data

Sep. 17, 2003 (FR) .................................. 03 10912

(51) Int. Cl.
*B32B 9/00* (2006.01)
*B32B 15/00* (2006.01)

(52) U.S. Cl. ................ 428/426; 428/432; 428/433; 428/434; 428/469; 428/702

(58) Field of Classification Search ............... 428/469, 428/701, 702, 698
See application file for complete search history.

(56) References Cited

U.S. PATENT DOCUMENTS

| | | | | |
|---|---|---|---|---|
| 5,948,538 A | * | 9/1999 | Brochot et al. | 428/432 |
| 6,316,110 B1 | * | 11/2001 | Anzaki et al. | 428/432 |
| 6,391,462 B1 | * | 5/2002 | Jang | 428/432 |
| 6,572,940 B1 | | 6/2003 | Noethe et al. | |
| 2003/0049464 A1 | * | 3/2003 | Glenn et al. | 428/432 |

OTHER PUBLICATIONS

U.S. Appl. No. 10/572,286, filed Mar. 16, 2006, Fleury et al.
U.S. Appl. No. 10/581,056, filed May 30, 2006, Fleury et al.

* cited by examiner

*Primary Examiner*—Timothy M Speer
(74) *Attorney, Agent, or Firm*—Oblon, Spivak, McClelland, Maier & Neustadt, P.C.

(57) ABSTRACT

An article where a transparent substrate, -is provided with a thin-film multilayer composed of-three silver layers and alternately on the substrate, a titanium dioxide layer, a zinc metal oxide layer, one of the silver layers (Ag1, Ag2, Ag3) and a covering layer including a sacrificial metal.

18 Claims, 1 Drawing Sheet

TRANSPARENT SUBSTRATE COMPRISING A STACK OF THIN LAYERS FOR ELECTROMAGNETIC ARMOUR

The subject of the invention is a transparent substrate, especially made of glass, which is coated with a thin-film multilayer, comprising at least one metal layer, for electromagnetic shielding.

The invention will be more particularly described for the use of such a substrate in a plasma display screen; however, it is not limited to such an application, it being possible for the substrate to be inserted into any electromagnetic shielding wall.

A plasma display screen comprises a plasma gas mixture (Ne, Xe, Ar) trapped between two glass plates, and phosphors placed on the internal face of the rear plate of the display. Ultraviolet light radiation emitted by the plasma gas mixture during the plasma discharge between the two glass plates interacts with the phosphors on the internal face of the rear plate in order to produce the visible light radiation (red, green or blue). A gas particle deexcitation mechanism competes with the UV emission, which generates infrared radiation between 800 and 1250 nm, the propagation of which, mainly through the front face of the display, may be the source of very troublesome interference, especially as regards equipment located nearby and controlled by infrared, for example by means of remote controls.

Moreover, like all electronic apparatus, plasma display screens possess addressing systems or drivers that may generate parasitic radiation which must not interfere with other devices, such as microcomputers, mobile telephones, etc.

To eliminate, or at the very least attenuate, the propagation of such radiation, one solution consists in placing against the front face of the display a window, also called a filter, which is both transparent and metallized in order to provide electromagnetic shielding. This filter is, for example, a transparent substrate coated with thin silver-based layers that reflect the electromagnetic waves in the frequency range from 30 MHz to 1 GHz and infrared beyond 800 nm.

Thus, patent FR 2 641 272 proposes a substrate comprising a reflective silver layer sandwiched between a transparent sublayer that comprises at least one layer of a metal oxide, and a transparent covering layer that comprises a layer of sacrificial metal oxide, a zinc oxide layer, the thickness of which does not exceed 15 nm, and an upper covering layer of a metal oxide.

The silver layer preferably has a thickness of between 8 and 12 nm.

The metal oxide layer of the sublayer may be chosen from several oxides and may be a mixture of several oxides. A preferred example is a titanium dioxide layer and a tin oxide layer deposited on said titanium dioxide.

The object of the sacrificial metal oxide is to protect the silver layer from oxidation, in particular during its deposition when this is carried out by the technique of sputtering. This is because, if the silver were to be impaired, the coated substrate would lose its low emissivity and its light transmission would be greatly reduced. The sacrificial metal often preferred is titanium, as it provides the silver with very effective protection against oxidation and has the advantage of being easily oxidized, to form an oxide of very low absorbency.

The zinc oxide layer serves as protection against the penetration of oxygen into the lower layers and allows the thickness of sacrificial metal to be reduced somewhat, this metal then being more easily, more completely and more uniformly oxidized. The above document requires a limited thickness for the zinc oxide layer of 15 nm, in particular so as to give the layer good light transmission properties.

However, such a substrate with a single metal layer is not suitable for obtaining sufficient electromagnetic shielding, such as to have a surface resistance of less than 1.8 $\Omega/\square$. Furthermore, other patent applications propose multilayers containing a plurality of metal layers, in particular silver layers. However, it is known that increasing the number of layers reduces the light transmission; a compromise between thicknesses and types of layer must therefore be found in order to achieve satisfactory light transmission.

The patent application published under WO 01/81262 proposes a multilayer having two silver layers, with a thickness $e_1$ in the case of the silver layer closest to the substrate and a thickness $e_2$ for the other layer, a sacrificial metal oxide, such as titanium oxide, being placed above each silver layer in order to protect it. One example of a sequence is the following:

substrate/$Si_3N_4$/ZnO/Ag/Ti/$Si_3N_4$/ZnO/Ag/Ti/ZnO/ $Si_3N_4$.

To achieve a surface resistance of less than 1.8 $\Omega/\square$, while still maintaining a suitable light transmission, the ratio of the thicknesses $e_1/e_2$ is between 0.8 and 1.1, preferably between 0.9 and 1, and the total thickness of the metal layers, $e_1+e_2$, is between 27.5 and 30 nm, preferably between 28 and 29.5 nm.

European patent application EP 1 155 816 discloses a multilayer having three, or even four, silver layers with an alternation of a titanium oxide layer and of a layer having a refractive index of less than 2.4 at a wavelength of 550 nm, such as for example zinc oxide or preferably silica nitride. The thickness of the silver layer closest to the substrate and of that furthest away is preferably equal to 0.5 to 1 times the thickness of the other silver layer. An example of a sequence having a surface resistance of 1.5 $\Omega/\square$, with a light transmission of 67%, is given with three palladium-doped silver layers each having a thickness of 16 nm. This sequence is the following:

substrate/$TiO_x$/$SiN_x$/Ag/$SiN_x$/$TiO_x$/$SiN_x$/Ag/$SiN_x$/$TiO_x$/ $SiN_x$/Ag/$SiN_x$/$TiO_x$.

However, it is always desirable for the properties of existing solutions to be further improved, and thus obtain an even more substantial reduction in surface resistance without degrading the light transmission.

The object of the invention is therefore to find another filter solution, especially for a plasma display screen, in order to alleviate the problem of electromagnetic wave transmission, while still achieving satisfactory optical properties.

According to the invention, the transparent substrate, especially made of glass, provided with a thin-film multilayer that includes three silver layers and comprises, alternately on the substrate, a titanium dioxide layer, a metal oxide layer, one of the silver layers and a covering layer, characterized in that:
 the metal oxide is zinc oxide;
 the covering layer is a sacrificial metal; and
 an antireflection layer comprising at least one metal oxide is deposited on the covering layer for the silver layer furthest away from the substrate.

According to one feature, the thickness of each of the silver layers is between 13 nm and 19 nm. The thicknesses ($e_{Ag1}$, $e_{Ag2}$, $e_{Ag3}$) of the three respective layers ($Ag_1$, $Ag_2$, $Ag_3$) are identical, or else they vary in a ratio of between 0.8 and 1.2 and are such that $e_{Ag1} \leq e_{Ag3} \leq e_{Ag2}$.

According to another feature, the titanium dioxide layer as sublayer for the silver layer ($Ag_1$) closest to the substrate has a thickness of between 10 and 20 nm, preferably between 10 and 15 nm, and the titanium oxide layers as sublayers for the other two silver layers ($Ag_2$, $Ag_3$) have a thickness of between 35 and 55 nm, preferably between 40 and 50 nm.

Preferably, the zinc oxide layer has a thickness of greater than 15 nm.

Advantageously, the sacrificial metal layer is of niobium, titanium or zirconium, and has a thickness not exceeding 2 nm.

According to another feature, the antireflection layer has a thickness of between 25 and 50 nm, preferably between 25 and 35 nm. Advantageously, this antireflection layer includes at least one titanium dioxide layer having a thickness of between 15 and 35 nm, preferably between 20 and 30 nm, and may also include another layer of a metal oxide that is deposited on said titanium dioxide layer and has a thickness of between 5 and 15 nm, preferably between 6 and 10 nm. This metal oxide layer is preferably tin oxide ($SnO_2$) or silicon nitride ($Si_3N_4$).

With such features, the substrate according to the invention has a surface resistance not exceeding 1 $\Omega/\square$, preferably between 0.7 and 0.9 $\Omega/\square$.

The substrate may be made of toughened or untoughened glass, or made of plastic.

It will be advantageous to use such a substrate in an electromagnetic shielding filter, applied for example to a display screen of the plasma display type. This filter therefore comprises a substrate provided with the multilayer of the invention, together with one or more functional plastic sheets (for example with pigments or dyes) and/or another transparent substrate, optionally coated with an antireflection layer, so as to have the following optical properties:

a light transmission factor $T_L$ of between 45 and 55%;
a purity of less than 10% in transmission;
a light reflection $R_L$ of less than 5%, preferably less than 4%;
a predominantly violet-blue color in reflection with a purity of less than 20%;
a predominantly blue color in transmission.

Other features and advantages of the invention will now be described with regard to the appended drawings, in which.

It should firstly be pointed out that the proportions relating to the various dimensions, especially thicknesses, of the elements of the invention have not been drawn to scale in the figures so that they are easier to read.

Figure 1:
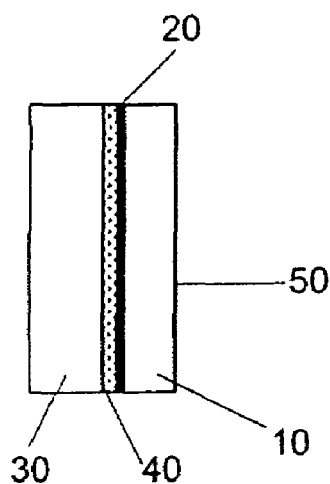
FIG. 1 illustrates a first embodiment of an electromagnetic shielding filter.

FIG. 1 illustrates a first example of an embodiment of the transparent structure 1 intended to be joined to the front face of a plasma display in order to form an optical and electromagnetic shielding filter.

The structure 1 comprises a first transparent substrate 10, which for example is of the glass type but which could, as a variant, be made of plastic, intended to be placed on the same side as the display, a thin-film multilayer 20 according to the invention, which is placed on the internal face of the substrate 10, facing the inside of the structure, a second substrate 30 of the glass type, which is joined to the first substrate, facing the multilayer 20, by means of a plastic film 40, such as a PVB film. This functional plastic film may advantageously include a mineral pigment or an organic dye so as to filter the orange color of wavelength centered on 590 nm. The reader may refer for further details about the plastic film or alternative embodiments of the structure to French patent application FR 03/04636.

The external faces of the substrates 10 and 30 to the outside of the structure are preferably provided with an antireflection coating 50.

Figure 2:
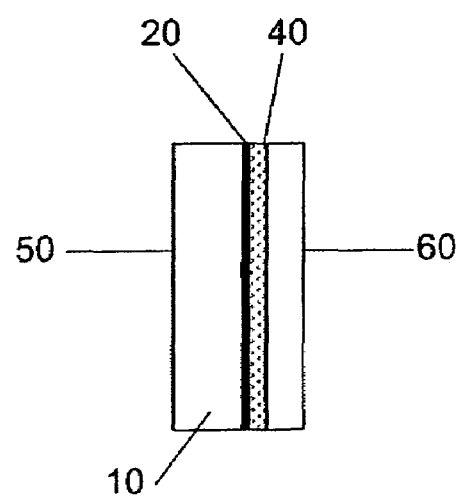
FIG. 2 illustrates a second embodiment of an electromagnetic shielding filter.
Figure 3:
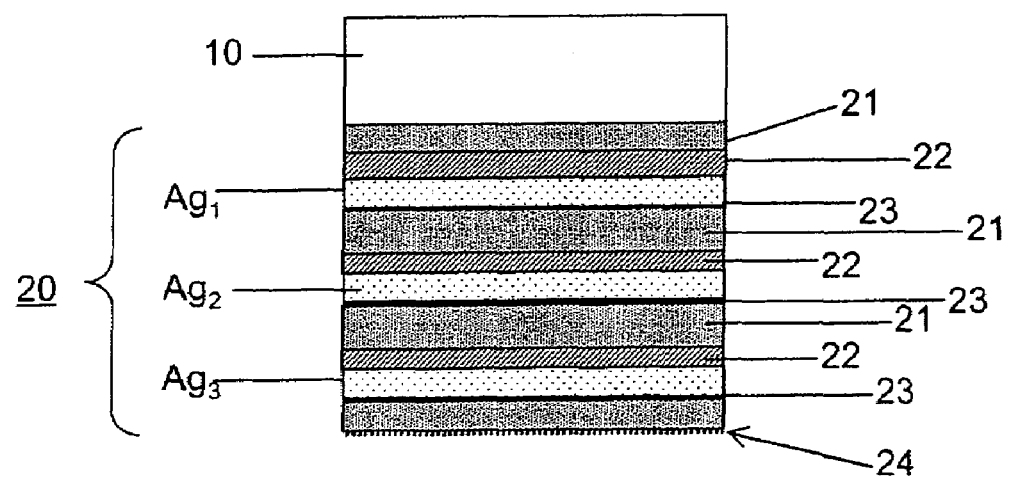
FIG. 3 illustrates schematically the multilayer of the invention.

FIG. 2 illustrates a second example of an embodiment of the structure 1, which in this case comprises a substrate 10 one of the faces of which, intended to be on the opposite side from the observer, is provided with the thin-film multilayer 20, and a substrate 60 made of plastic, such as PET, which is intended to be placed on the same side as the display and is joined to the substrate 10, facing the multilayer 20, by means of a plastic film 40, such as a PVB film, which may advantageously incorporate other functionalities as described above in the first embodiment. The external face of the substrate 10, to the outside of the structure, is preferably provided with an antireflection coating 50.

The invention therefore relates to the multilayer 20 deposited on a substrate, such as the substrate 10. This multilayer includes three metallic silver layers, $Ag_1$ being the layer closest to the substrate, $Ag_2$ being the central layer and $Ag_3$ being the one furthest away, the function of which is to reflect the electromagnetic waves having a frequency between 30 MHz and 1 GHz and infrared waves beyond 800 nm.

The multilayer includes, deposited alternately on the substrate, a titanium dioxide layer 21, a layer 22 of a metal oxide, consisting of zinc oxide, one of the silver layers $Ag_1$, $Ag_2$ or $Ag_3$, and a layer 23 of a sacrificial metal coating. Deposited on top of the sacrificial metal layer 23, which is deposited on the silver layer $Ag_3$ furthest from the substrate, is an antireflection layer 24 consisting of at least one metal oxide.

The thickness of each of the silver layers $Ag_1$, $Ag_2$ and $Ag_3$ is between 13 nm and 19 nm. The thicknesses $e_{Ag1}$, $e_{Ag2}$ and $e_{Ag3}$ of the respective layers $Ag_1$, $Ag_2$ and $Ag_3$ may be identical or they may vary in a ratio of between 0.8 and 1.2 and are such that $e_{Ag1} \leq e_{Ag3} \leq e_{Ag2}$. The imbalance in layer thicknesses is preferential, so as to lower the light reflection while maintaining the same surface resistance.

The titanium oxide layer 21 as sublayer for the silver layer $Ag_1$ close to the substrate has a thickness of between 10 and 20 nm, preferably between 10 and 15 nm.

The titanium oxide layers 21 as sublayers for the other two silver layers $Ag_2$ and $Ag_3$ have a thickness of between 35 and 55 nm, preferably between 40 and 50 nm.

The zinc oxide layer 22 preferably has a thickness of greater than 15 nm, for example 16 or 18 nm.

The sacrificial metal layer 23 is of niobium, titanium or zirconium, preferably titanium, and has a thickness of at most 2 nm, for example 1.5 nm.

This sacrificial metal layer makes it possible to protect the silver against oxidation, and to improve its resistivity. Although the presence of titanium may degrade the light transmission, it does allow an even lower surface resistance to be obtained, while maintaining a sufficiently correct light transmission. The compromise to be found between the optical properties of the filter and its shielding properties is provided by giving preference to shielding, while still maintaining good optical properties. Thus, with the sequence of the invention based on three silver layers, the surface resistance drops to 0.8 $\Omega/\square$, instead of 1.5 according to the prior art, which not only meets Class A of European Standard EN 55022, dealing with what are called "consumer" products, but also Class B, dealing with special products of the home-cinema type.

The antireflection layer 24 for the silver layer $Ag_3$ remote from the substrate has a thickness of between 25 and 50 nm, preferably between 25 and 35 nm. It comprises at least titanium dioxide with a thickness of between 15 and 35 nm, preferably between 20 and 30 nm.

Advantageously, deposited on top of the titanium dioxide of this antireflection layer is another metal oxide, of small thickness, between 5 and 15 nm, and preferably between 6 and 10 nm. This metal oxide is, for example, tin oxide ($SnO_2$) or silica nitride ($Si_3N_4$)—which helps to improve the purity of the colors in reflection and in transmission.

All the layers of the multilayer are deposited on the substrate by the known technique of sputtering.

In the table below, we given give five examples (Ex 1 to Ex 5) of the multilayer 20 of the invention. Provided in the table are the thicknesses (in nm) of each layer and, for each multilayer joined to a substrate 10, the values of the light transmission $T_L$ (in %), the light reflection $R_L$ (in %), the purity in transmission $p_e$ in T (in %), the purity in reflection $p_e$ in R (in %), the dominant wavelengths in transmission and in reflection, respectively $\lambda_d$ in T and $\lambda_d$ in R (in nm) and the surface resistance $R_{surf}$ (in $\Omega/\square$).

These five examples make it possible to achieve suitable shielding less than 1 $\Omega/\square$.

In the case of examples 1, 2 and 5, the silver layers are the same and equal to 15 nm; the zinc oxide thicknesses are different, with a thickness of less than 15 nm, exactly equal to 10 nm in the case of example 5. For each example, the thickness of the titanium dioxide layers is fixed so as to optimize the optical properties of the multilayer.

The results show that, for examples 1 and 2 which have larger zinc oxide thicknesses than example 5 (from 6 to 8 nm and higher), the light transmission, contrary to what might be expected as regards the prior art, remains substantially the same and even slightly better in the case of example 1 with a zinc oxide thickness of 18 nm, and the reflection has the advantage, in the case of examples 1 and 2, of being lower than in the case of example 5, thereby making it possible for the display to be illuminated less brightly and aggressively for the observer.

Examples 3 and 4 provide a comparison, with unequal thicknesses as regards the silver layers, with, in the case of example 4, an antireflection layer 25 based on $SnO_2$. It may be seen that the imbalance has the advantage of reducing the light reflection but has the drawback of increasing the purity in transmission and in reflection; the addition of the antireflection layer helps to overcome this drawback and thus obtain a purity in transmission equivalent or substantially equivalent to that of examples 1, 2 and 5, and to reduce the purity in reflection compared with that of example 3.

|  | Ex 1 | Ex 2 | Ex 3 | Ex 4 | Ex 5 |
| --- | --- | --- | --- | --- | --- |
| $TiO_2$ | 12 | 12 | 12 | 12 | 13 |
| ZnO | 18 | 16 | 16 | 16 | 10 |
| $Ag_1$ | 15 | 15 | 13.5 | 13.5 | 15 |
| Ti | 1.5 | 1.5 | 1.5 | 1.5 | 1.6 |
| $TiO_2$ | 43 | 43 | 43 | 43 | 48 |
| ZnO | 18 | 16 | 16 | 16 | 10 |
| $Ag_2$ | 15 | 15 | 16.5 | 16.5 | 15 |
| Ti | 1.5 | 1.5 | 1.5 | 1.5 | 1.5 |
| $TiO_2$ | 43 | 43 | 43 | 43 | 48 |
| ZnO | 18 | 16 | 16 | 16 | 10 |
| $Ag_3$ | 15 | 15 | 15 | 15 | 15 |
| Ti | 1.5 | 1.5 | 1.5 | 1.5 | 1.5 |
| $TiO_2$ | 25 | 25 | 25 | 25 | 25 |
| $SnO_2$ | 0 | 0 | 0 | 7 | 0 |
| $T_L$ in % | 62 | 61 | 62 | 65 | 61 |
| $R_L$ in % | 5.8 | 5.0 | 4.7 | 4.7 | 6 |
| $p_e$ in T (%) | 5 | 6 | 9 | 6 | 5 |
| $\lambda_d$ in T (nm) | 500 | 490 | 496 | 499 | 500 |
| $p_e$ in R (%) | 30 | 20 | 50 | 40 | 30 |
| $\lambda_d$ in R (nm) | −555 | −560 | −553 | −547 | −555 |
| $R_{surf}$ ($\Omega/\square$) | 0.8 | 0.8 | 0.8 | 0.8 | 0.8 |

Thus, by controlling the deposition of the silver and dielectric layers and the thicknesses formulated according to the invention, and also by the use of metal protection layers, the filter obtained with reference to FIG. 1 or FIG. 2 has the following properties:

a surface resistance of less than 1 $\Omega/\square$;
a light transmission factor $T_L$ of between 45 and 55%;
a purity in transmission of less than 10%;
a light reflection $R_L$ of less than 5%, preferably less than 4%;
a predominantly violet-blue color in reflection with a purity of less than 20%; and
a predominantly blue color in transmission.

The electromagnetic shielding filter using the substrate of the invention may be applied to a display screen, in particular a plasma display. It provides very good performance as regards shielding (the surface resistance being less than 1 $\Omega/\square$), and it consequently blocks especially infrared with a transmission at 900 nm that does not exceed 1%. This filter also provides good visibility—a light transmission factor between 45 and 55%—and improves the contrast of the display.

The invention claimed is:

1. An article, comprising a transparent substrate, provided with a thin-film multilayer comprising three silver layers ($Ag_1$, $Ag_2$, $Ag_3$) and alternately on the substrate, a titanium dioxide layer, a metal oxide layer, one of the silver layers ($Ag_1$, $Ag_2$, $Ag_3$) and a covering layer and an antireflection layer comprising at least one metal oxide is deposited on the covering layer for the silver layer ($Ag_3$) furthest away from the substrate, wherein:
the metal oxide is zinc oxide;
the covering layer is a sacrificial metal; and
wherein the thicknesses ($e_{Ag1}$, $e_{Ag2}$, $e_{Ag3}$) of the silver layers ($Ag_1$, $Ag_2$, $Ag_3$) vary in a ratio of between 0.8 and 1.2 and are such that $e_{Ag1} \leq e_{Ag3} \leq e_{Ag2}$ and wherein $e_{Ag1}$ corresponds to the thickness of the silver layer closest to the substrate and $e_{Ag3}$ corresponds to the thickness of the silver layer furthest from the substrate.

2. The article as claimed in claim 1, characterized in that the thickness of each of the silver layers ($Ag_1$, $Ag_2$, $Ag_3$) is between 13 nm and 19 nm.

3. The article as claimed in claim 1, wherein the titanium dioxide layer as sublayer for the silver layer ($Ag_1$) closest to the substrate has a thickness of between 10 and 20 nm, and the titanium oxide layers as sublayers for the other two silver layers ($Ag_2$, $Ag_3$) have a thickness of between 35 and 55 nm.

4. The article as claimed in claim 1, wherein the zinc oxide layer has a thickness of greater than 15 nm.

5. The article as claimed in claim 1, wherein the sacrificial metal layer is of niobium (Nb), titanium (Ti) or zirconium (Zr).

6. The article as claimed in claim 1, wherein the sacrificial metal layer has a thickness not exceeding 2 nm.

7. The article as claimed in claim 1, wherein the antireflection layer has a thickness of between 25 and 50 nm.

8. The article as claimed in 7, wherein the antireflection layer includes at least one titanium dioxide layer having a thickness of between 15 and 35 nm.

9. The article as claimed in claim 8, wherein the antireflection layer includes a titanium dioxide layer and another layer of a metal oxide that is deposited on said titanium dioxide layer and has a thickness of between 5 and 15 nm.

10. The article as claimed in claim 9, wherein the metal oxide layer of the antireflection layer is tin oxide ($SnO_2$) or silica nitride ($Si_3N_4$).

11. The article as claimed in claim 7, wherein the antireflection layer has a thickness between 25 and 35 nm.

12. The article as claimed in claim 1, which has a surface resistance not exceeding 1 Ω/□.

13. The article as claimed in claim 1, wherein the transparent substrate is made of toughened glass, untoughened glass, or plastic.

14. An electromagnetic shielding filter comprising the article as claimed in claim 1, and wherein the electromagnetic shielding filter has the following optical properties:
 a light transmission factor $T_L$ of between 45 and 55%;
 a purity of less than 10% in transmission;
 a light reflection $R_L$ of less than 5%;
 predominantly violet-blue color in reflection with a purity of less than 20%; and
 a predominantly blue color in transmission.

15. A display screen comprising on its front face, at least one electromagnetic shielding filter as claimed in claim 14.

16. The display screen as claimed in claim 15, which is a plasma display.

17. The article as claimed in claim 1, wherein the transparent substrate is made of glass.

18. A display screen, comprising on its front face, at least one article as claimed in claim 1.

* * * * *